United States Patent [19]

Takasaki

[11] Patent Number: 4,741,919
[45] Date of Patent: May 3, 1988

[54] PROCESS FOR PREPARATION OF SEMICONDUCTOR DEVICE

[75] Inventor: Kanetake Takasaki, Tokyo, Japan

[73] Assignee: Fujitsu Limited, Kawasaki, Japan

[21] Appl. No.: 77,293

[22] Filed: Jul. 24, 1987

[30] Foreign Application Priority Data

Jul. 25, 1987 [JP] Japan .................. 61-173590

[51] Int. Cl.$^4$ .................................... B05D 3/06
[52] U.S. Cl. ........................ 427/38; 427/314
[58] Field of Search .................. 427/38, 314

Primary Examiner—Bernard D. Pianalto
Attorney, Agent, or Firm—Staas & Halsey

[57] ABSTRACT

A process for the preparation of a semiconductor device by the plasma chemical vapor deposition of amorphous silicon on a substrate, which comprises generating plasma in a deposition furnace by using a high frequency wave of less than 1 MHz to deposit an amorphous silicon film, and generating oxygen plasma in the same deposition furnace and irradiating the amorphous silicon film with the oxygen plasma.

9 Claims, 2 Drawing Sheets

PROCESS FOR PREPARATION OF SEMICONDUCTOR DEVICE

BACKGROUND OF THE INVENTION

1. Field of the Invention

The present invention relates to a process for the preparation of semiconductor device. More specifically, the present invention relates to a process for improving the electrical characteristics of amorphous silicon to be used for a photodiode or the like.

2. Description of the Related Art

A gap cell type photodiode shown in FIG. 3 is known. In FIG. 3, reference numeral 11 represents a glass substrate, reference numeral 12 represents an amorphous silicon film (a-Si:H film), reference numeral 13 represents an Al electrode, and reference numeral 14 represents a white light of, for example, 1000 lx.

An apparatus for depositing an amorphous silicon film is shown in FIG. 2. In FIG. 2, reference numeral 21 represents a reaction furnace (quartz jar), reference numeral 22 represents a heater, reference numeral 23 represents an electrode, reference numeral 24 represents a radio frequency (RF) generator, reference numeral 25 represents a gas-introducing pipe, reference numeral 26 represents an exhaust opening, and reference numeral 28 represents a susceptor. The heater 22 is disposed to heat the glass substrate 11 on which an amorphous silicon film is deposited. The substrate and one end of the RF generator 24 are grounded, and when the RF generator 24 is turned on, plasma 27 indicated by dots in FIG. 2 is generated between the electrode 23 and the substrate 11, and Si of a silane gas (SiH$_4$) introduced through the gas-introducing pipe 25 is precipitated and deposited on the glass substrate 11 to form an amorphous silicon film (a-Si:H). A diluent gas such as H$_2$ or Ar may be added to SiH$_4$. It is understood that the structure of a so-prepared amorphous silicon is as follows:

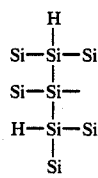

The plasma chemical vapor deposition process (CVD process) using an exciting high frequency wave of 13.56 MHz has been adopted for formation of an amorphous silicon layer (e.g., Japanese Journal of Applied Physics, Vol. 21, No. 3, March, 1982, pp. 413–417). If this high frequency wave is used, the number of dangling bonds is small and amorphous silicon having excellent electrical characteristics [dark electroconductivity $\sigma d$ is small and bright electroconductivity (photoconductivity) $\sigma p$ is large] is easily obtained. However, this process is defective in that the formed amorphous silicon has a poor heat durability (below 300° C.) and adhesion to the glass substrate as the base.

On the other hand, when an exciting wave of a frequency of less than 1 MHz is used, an amorphous silicon film having an excellent heat durability and adhesion can be obtained, but the above-mentioned electrical characteristics are poor.

If the heat durability is poor at a temperature lower than 300° C., the preparation of a device becomes difficult. A high heat durability is an indispensable requirement for the preparation process, and the adhesion to the substrate is necessary for preventing the amorphous silicon film from peeling from the substrate. Moreover, a smaller $\sigma d$ and larger $\sigma p$ are preferred for the electrical characteristics.

The foregoing are summarized in Table 1.

TABLE 1

|  | High Frequency | Low Frequency |
|---|---|---|
| Heat Durability | Δ | o |
| Adhesion to Substrate | Δ | o |
| Electrical Characteristics | o | Δ |

In Table 1, "o" indicates good and "Δ" indicates bad.

SUMMARY OF THE INVENTION

Under this background, the present invention has been completed. It is therefore a primary object of the present invention to provide a process for depositing an amorphous silicon film by the plasma CVD process using RF, in which an amorphous silicon layer having an excellent heat durability and a good adhesion to the substrate is formed.

According to the present invention, there is provided a process for the preparation of a semiconductor device by the plasma chemical vapor deposition of amorphous silicon (a-Si:H) on a substrate, which comprises generating plasma in a deposition furnace 21 by using a high frequency wave of less than 1 MHz to deposite an a-Si:H film, and generating oxygen (O$_2$) plasma in the same deposition furnace and irradiating the a-Si:H film with the oxygen plasma.

DESCRIPTION OF THE PREFERRED EMBODIMENTS

According to the present invention, an amorphous silicon film deposited by the plasma CVD process using a wave having a frequency of less than 1 MHz is exposed to O$_2$ plasma. It is understood that when the amorphous silicon film is exposed to O$_2$ plasma as described above, since O$_2$ plasma has a high activity, O* radicals are included in dangling bonds and the dark electroconductivity is further reduced.

The present invention will now be described in detail, by way of example, with reference to the accompanying drawings.

With reference to the structure of the amorphous silicon film again, in the growth of amorphous silicon, a-Si:H is formed by bonding H to Si in SiH$_4$, but although the number of dangling bonds is small in the growth of amorphous silicon, dangling bonds are still present, as is seen from the above-mentioned structural formula. Thus, in the deposited amorphous silicon film, where the film is deposited using a high frequency wave, e.g., of 13.56 MHz as mentioned hereinbefore, the number of SiH₂ bonds is large to deteriorate the heat durability and the contribution of ions is small to result in a poor adhesion, while the number of dangling bonds is small to produce excellent electrical characteristics. On the other hand, where the film is deposited using a relatively low frequency wave, e.g. of less than 1 MHz as mentioned herein before, the number of SiH₂ bonds is small to improve the heat durability and the contribution of ions is large to cause an excellent adhesion, while the number of dangling bonds is large to deteriorate the electrical characteristics.

Figure 4:
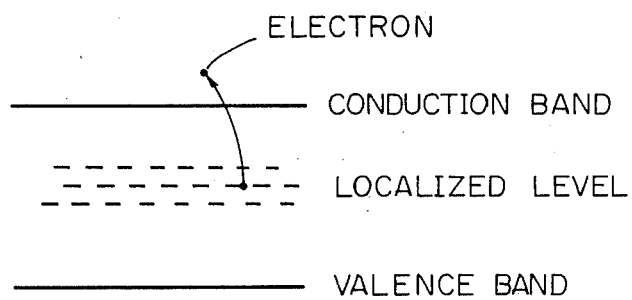
FIG. 4 is a diagram illustrating the localized level in a-Si:H.

When the conduction band and valence band of amorphous silicon are examined, it is seen that, as shown in FIG. 4, a localized level indicated by a broken line is present between both bands, which is due to the presence of dangling bonds in the amorphous silicon. The dark electroconductivity of amorphous silicon depends on the conduction of electrons, indicated by black dots in FIG. 4, thermally excited to the conduction band from the localized level. Therefore, a further decrease of the number of dangling bonds is effective for reducing the dark electroconductivity.

Figure 2:
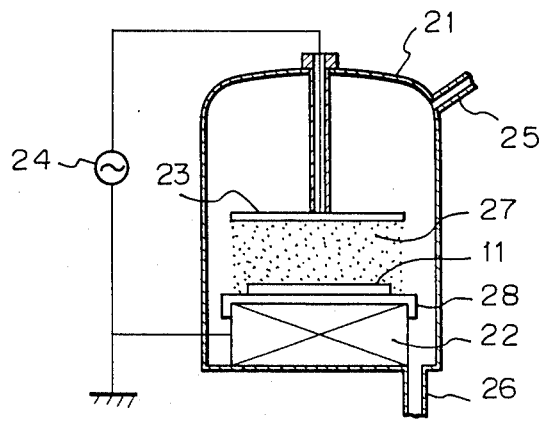
FIG. 2 is a sectional view of the apparatus used in carrying out the present invention.
Figure 3:
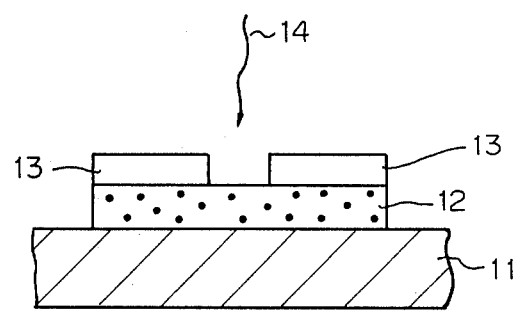
FIG. 3 is a sectional view of a gap cell type photodiode.

According to the present invention, by using the apparatus shown in FIG. 2, an amorphous silicon film is grown at a high frequency on the glass substrate 11, and supply of the SiH₄ gas is stopped and an O₂ gas is supplied instead into the quartz jar 21 to form O₂ plasma. The substrate 11 is irradiated with this O₂ plasma.

In the present invention, the plasma CVD process may be carried out under usual conditions except for the use of a relatively low frequency wave below 1 MHz, preferably 30 to 500 KHz. Then, the O₂ plasma treatment may be carried out under the conditions of a substrate temperature of 200° to 350° C., a pressure of 0.2 to 2 Torr. and a power of 50 to 500 mW/cm². The frequency is not critical in the O₂ plasma treatment, and a wave of a frequency of 30 KHz to 13.56 MHz may suitably be used.

The process of the present invention is carried out in the following manner. A vacuum of 1 Torr is maintained in the quartz jar 21 and a high frequency wave having a low frequency of 200 KHz having a power of 100 mW/cm² is generated by the RF generator, and an SiH₄ gas is used for the growth of a-Si:H. After an a-Si:H film having a predetermined thickness, generally of about 1 μm, has been deposited, an O₂ gas is supplied instead of the SiH₄ gas. The time of irradiation with O₂ plasma is adjusted to 30 to 40 minutes. The so-obtained a-Si:H film is satisfactory in all of the heat durability, the adhesion to the substrate and the electrical characteristics. The frequency of the high frequency wave generated by RF is not limited to the above-mentioned value, and RF of the kiloherz order of 30 KHz to 500 KHz can be used.

Figure 1:
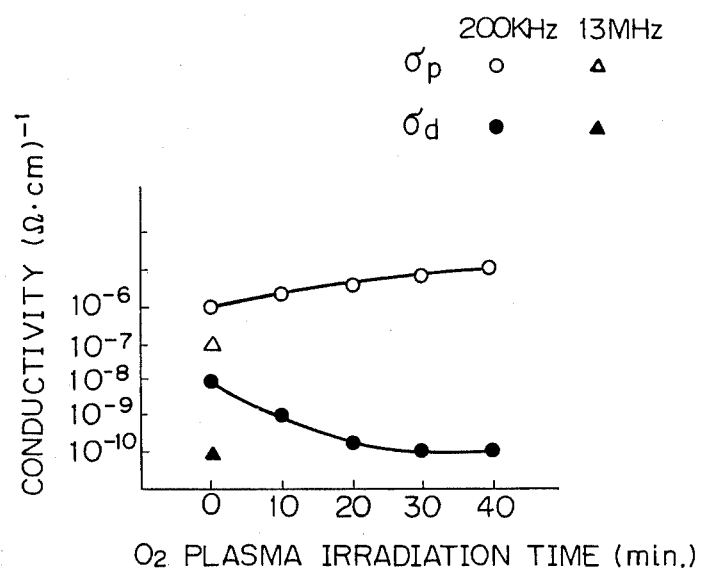
FIG. 1 is a graph illustrating the relationship between the time of irradiation with O$_2$ plasma and the electro-conductivity in a-Si:H.

We examined the relation between the time of irradiation with O₂ plasma and the electroconductivity and obtained the results shown in FIG. 1. Note, the O₂ plasma irradiation time, expressed by minutes, is plotted on the abscissa and the electroconductivity ($\Omega$-cm$^{-1}$) is plotted on the ordinate. In FIG. 1, white circles and black circles indicate the photoconductivity and dark electroconductivity of a-Si:H formed by using a high frequency wave having a frequency of 200 KHz, respectively, and white triangles and black triangles indicate the photoconductivity and dark electroconductivity of a-Si:H formed by using a high frequency wave having a frequency of 13 MHz, respectively.

As shown in FIG. 1, the dark photoconductivity of a Si:H formed by a high frequency wave having a frequency of 200 KHz is higher before irradiation with O₂ plasma than that of a-Si:H formed by using a high frequency wave having a frequency of 13 MHz, but when irradiation with O₂ plasma is carried out for 30 minutes, the dark electroconductivity becomes substantially equal to that of a-Si:H formed by using a high frequency wave having a frequency of 13 MHz.

On the other hand, the photoconductivity of a-Si:H formed by using a high frequency wave having a frequency of 200 KHz is slightly higher before irradiation with O₂ plasma than that of a-Si:H formed by using a high frequency wave of 13 MHz, and the value of the photoconductivity is increased as the time of irradiation with O₂ plasma is prolonged.

As is apparent from the foregoing description, the dark electroconductivity of a-Si:H formed by using a high frequency wave having a frequency of 200 KHz is reduced by irradiation with O₂ plasma, and the photoconductivity is increased by irradiation with O₂ plasma. Accordingly, in Table 1 illustrating the characteristics of a-Si:H formed by a high frequency wave having a high frequency and a-Si:H formed by a high frequency wave having a low frequency, all the characteristics become "o" in the "Low Frequency" column. Namely, an a-Si:H film having a high heat durability (up to 450° C. according to our experiments) and a good adhesion to the substrate, and having excellent electrical characteristics, is obtained. In this connection, although the plasma treatment after the plasma CVD deposition was carried out using, instead of the O₂ gas, a H₂, CO₂, CO, N₂O, N₂ or NH₃ gas, no significant improvement of the electrical characteristics of the deposited amorphous silicon film was attained.

As is apparent from the foregoing description, according to the present invention, a photodiode device having a high heat durability, a good adhesion to the substrate, and excellent electrical characteristics, that is, a low dark electroconductivity and a high photoconductivity, can be prepared. Furthermore, if this a-Si:H is used for TFT, a transistor in which the $I_{on}/I_{off}$ ratio can be increased is obtained, and a solar cell in which the change with the lapse of time is small is obtained.

I claim:

1. A process for the preparation of a semiconductor device by the plasma chemical vapor deposition of amorphous silicon on a substrate, which comprises generating plasma in a deposition furnace by using a high frequency wave of less than 1 MHz to deposit an amorphous silicon film, and generating oxygen plasma in the same deposition furnace and irradiating the amorphous silicon film with the oxygen plasma.

2. A process as set forth in claim 1, wherein the plasma chemical vapor deposition is carried out using a wave of a frequency of 30 to 500 KHz.

3. A process as set forth in claim 2, wherein the frequency is 200 KHz.

4. A process as set forth in claim 3, wherein the plasma chemical vapor deposition is carried out with a power of 100 mW/cm₂.

5. A process as set forth in claim 3, wherein the plasma chemical vapor deposition is carried out under a pressure of 1 Torr.

6. A process as set forth in claim 1, wherein the oxygen plasma treatment is carried out with a wave of a frequency of 30 KHz to 13.56 MHz.

7. A process as set forth in claim 1, wherein the oxygen plasma treatment is carried out at a substrate temperature of 200° to 350° C.

8. A process as set forth in claim 1, wherein the oxygen plasma treatment is carried out under a pressure of 0.2 to 2 Torr.

9. A process as set forth in claim 1, wherein the oxygen plasma treatment is carried out with a power of 50 to 500 mW/cm$_2$.

* * * * *

UNITED STATES PATENT AND TRADEMARK OFFICE
CERTIFICATE OF CORRECTION

PATENT NO. : 4,741,919

DATED : May 3, 1988

INVENTOR(S) : Kanetake TAKASAKI

It is certified that error appears in the above-identified patent and that said Letters Patent is hereby corrected as shown below:

Front Page [30], line 2, change "Jul. 25, 1987" to --Jul. 25, 1986--.

Col. 4, line 1, change "a" to -- a- --.

Signed and Sealed this

Eighteenth Day of October, 1988

*Attest:*

DONALD J. QUIGG

*Attesting Officer*      *Commissioner of Patents and Trademarks*